United States Patent
Lee et al.

(10) Patent No.: US 11,367,468 B1
(45) Date of Patent: Jun. 21, 2022

(54) SENSE AMPLIFIER

(71) Applicant: Taiwan Semiconductor Manufacturing Company, Ltd., Hsinchu (TW)

(72) Inventors: Chia-Fu Lee, Hsinchu (TW); Hon-Jarn Lin, New Taipei (TW); Yu-Der Chih, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/186,250

(22) Filed: Feb. 26, 2021

(51) Int. Cl.
*G11C 7/02* (2006.01)
*G11C 7/06* (2006.01)

(52) U.S. Cl.
CPC ........ *G11C 7/062* (2013.01); *G11C 2207/063* (2013.01)

(58) Field of Classification Search
CPC ..................................................... G11C 7/062
USPC ......................................................... 365/207
See application file for complete search history.

(56) References Cited

U.S. PATENT DOCUMENTS

| 2005/0213387 A1* | 9/2005 | Kubo ............... G11C 5/145 365/185.21 |
| 2015/0228333 A1 | 8/2015 | Chou et al. |
| 2020/0135260 A1 | 4/2020 | Venkata |

FOREIGN PATENT DOCUMENTS

TW  201447907 A  12/2014

\* cited by examiner

*Primary Examiner* — Hoai V Ho
(74) *Attorney, Agent, or Firm* — Merchant & Gould P.C.

(57) ABSTRACT

A sense amplifier is provided. A first terminal of a first invertor is connected to a power node and a second terminal of the first invertor is connected to a cell current source. A first terminal of a second invertor is connected to the power node and a second terminal of the second invertor is connected to a reference current source. The first invertor is cross coupled with the second invertor at a first node and a second node. A pre-charge circuit is connected to the first node and the second node. A first pull up transistor and a second pull up transistor are connected between a supply voltage node and the power node. A signal level detector circuit is connected to the second pull up transistor. The signal level detector circuit switches on the second pull up transistor when a remaining voltage on one of the first node and the second node is below a reference voltage.

12 Claims, 9 Drawing Sheets

SENSE AMPLIFIER

BACKGROUND

Modern electronic devices such as a notebook computer comprise a variety of memories to store information. Generally, a memory includes a plurality of memory cells arranged in rows and columns. Each memory cell stores a bit of information by means of a floating gate transistor. A sense amplifier is used to verify the logic state of a memory cell by comparing a memory cell current with a reference current. More particularly, a voltage potential is applied to the control gate of the memory cell and then a current flows through the memory cell in response to the voltage change at the control gate. The sense amplifier detects the current flowing through the memory cell and compares it with a predetermined reference current. When the memory cell current is more than the reference current, the sense amplifier reports a logic high, which means the memory cell stores a logic high state. In contrast, when the memory cell current is less than the reference current, the sense amplifier reports a logic low, which reflects the logic low state of the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
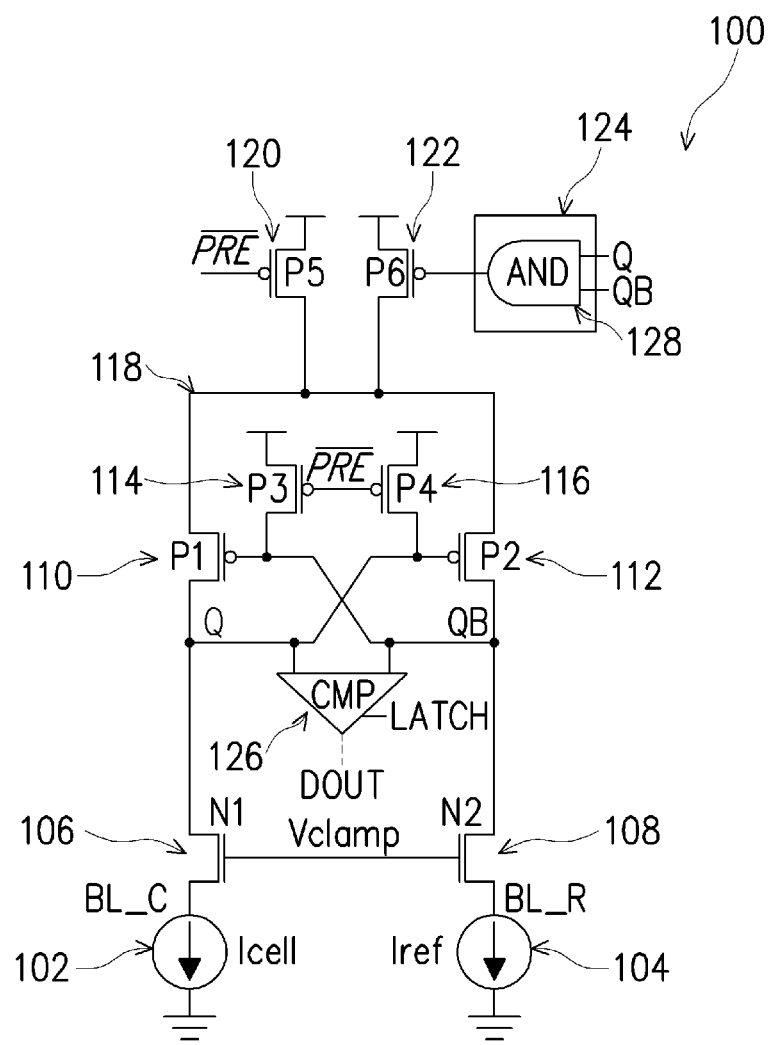
FIG. 1 is an example diagram of a sense amplifier in accordance with example embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Sense amplifiers include voltage mode sense amplifiers and current mode sense amplifiers. In a voltage mode sense amplifier, both a memory cell current and a reference current are converted into the corresponding voltages and further fed into inputs of the voltage mode sense amplifier. The read operation of the memory cell is performed by comparing the two voltages at the inputs of the voltage mode sense amplifier. The voltage mode sense amplifier reports the logic state of the memory cell based upon the comparison result.

In contrast, a current mode sense amplifier directly compares a memory cell current with a reference current. In a read operation of a memory cell, an invertor may be used to monitor the difference between the memory cell current and the reference current. More particularly, the invertor's input is coupled to both the reference current and the memory cell current. Furthermore, the difference between the reference current and the memory cell current is used to charge the input of the invertor. In accordance with the operation of flash memory circuits, when a memory cell stores a logic low state, the reference current is more than the memory cell current. As a result, the difference between the reference current and the memory cell current is a positive value, which means a charge current charges the input of the invertor to a level more than the trigger point of the invertor so that the current mode sense amplifier reports a logic low state. In contrast, when the memory cell stores a logic high state, the reference current is less than the memory cell current. As a result, the difference between the reference current and the memory cell current is a negative value, which means a discharge current discharging the input of the invertor down to a level below the trigger point of the invertor so that the current mode sense amplifier reports a logic high state.

FIG. 1 is an example diagram of a sense amplifier 100 in accordance with example embodiments. In some embodiments, sense amplifier reads data stored on a memory cell of a cell array. In some examples, the memory cell can be a Static Random Access Memory (SRAM) cell, a Resistive Random Access Memory (RRAM) cell, a Magneto-resistive Access Memory (MRAM) cell, a flash Random Access Memory (RAM) cell, or the like. In some examples, sense amplifier 100 of FIG. 1 is a voltage mode sense amplifier.

As shown in FIG. 1, sense amplifier 100 includes a cell current source Icell 102 and a reference current source (Iref) 104. A first terminal of cell current source Icell 102 is connected to ground. In addition, a first terminal of reference current source Iref 104 is connected to ground. In examples, a cell current Icell generated by cell current source Icell 102 has an amplitude corresponding to a programmed state of a memory cell being read. For example, if the data stored on the memory cell is binary "1," the cell current Icell may be a relatively high current. However, if the data stored on the memory cell is binary "0," the cell current Icell may be a relatively low current.

In some examples, cell current source Icell 102 and reference current source Iref 104 are mirrored to sense amplifier 100. In some embodiments, reference current source Iref 104 is another memory cell of a memory array including the memory cell that acts as cell current source 102. In some embodiments, the memory cell that acts as reference current source Iref 104 is not used in the memory array to store data (e.g., a dummy memory cell).

Sense amplifier 100 further includes a first transistor N1 106 and a second transistor N2 108. A drain of first transistor N1 106 is connected to a second terminal of cell current source Icell 102 and a source of first transistor N1 106 is connected to a Q node of sense amplifier 100. A drain of second transistor N2 108 is connected to a second terminal of reference current source Iref 104 and a source of second transistor N2 108 is connected to a QB node of sense amplifier 100. In examples, the Q node is complementary to the QB node. In some examples, the Q node is also referred to as a first node in this disclosure. In addition, the QB node is also referred to as a second node in this disclosure.

A gate of first transistor N1 106 is connected to a gate of second transistor N2 108. A clamping voltage Vclamp is applied to respective gates of first transistor N1 106 and second transistor N2 108. The Vclamp is applied to set a cap or an upper limit on gate voltages of a bit line (cell side) and a reference bit line (reference side). In some embodiments, therefore, first transistor N1 106 and second transistor N2 108 are also referred to as clamping transistors as they prevent high voltages from damaging cell current source Icell 102 and reference current source Iref 104.

In examples, first transistor N1 106 and second transistor N2 108 are an n-channel metal oxide semiconductor (nMOS) transistor. However, it will be apparent to a person with an ordinary skill in the art after reading this this disclosure that other types of transistors, such as, a metal oxide semiconductor field effect transistor (MOSFET), a p-channel metal oxide semiconductor (pMOS) transistor, or a complementary metal oxide semiconductor (CMOS) transistor can be used for each of first transistor N1 106 and second transistor N2 108. In addition, each of first transistor N1 106 and second transistor N2 108 is symmetrical. That is, a source of each of first transistor N1 106 and second transistor N2 108 can be a drain, and a drain can be a source.

Continuing with FIG. 1, sense amplifier 100 further includes a third transistor P1 110 and a fourth transistor P2 112. A source of third transistor P1 110 is connected to a power node 118 and a drain of third transistor P1 110 is connected to the Q node. A gate of third transistor P1 110 is connected to the QB node. A source of fourth transistor P2 112 is connected to power node 118 and a drain of fourth transistor P2 112 is connected to the QB node. A gate of fourth transistor P2 112 is connected to the Q node.

In examples, each of third transistor P1 110 and fourth transistor P2 112 is a pMOS transistor. However, it will be apparent to a person with an ordinary skill in the art after reading this this disclosure that other types of transistors, such as, a MOSFET, an nMOS transistor, or a CMOS transistor can be used for each of third transistor P1 110 and fourth transistor P2 112. In addition, each of third transistor P1 110 and fourth transistor P2 112 is symmetrical. That is, a source of each of third transistor P1 110 and fourth transistor P2 112 can be a drain, and a drain can be a source.

In some examples, first transistor N1 106 and third transistor P1 110 form a first invertor. In addition, second transistor N2 108 and fourth transistor P2 112 form a second invertor. The first invertor and the second invertor are cross coupled at the Q node and the QB node. In some examples, the first invertor and the second invertor can form a latch. In addition, in some examples, third transistor P1 110 and fourth transistor P2 112 form an amplifier circuit.

As shown in FIG. 1, sense amplifier 100 further includes a fifth transistor P3 114 and a sixth transistor P4 116. A source of fifth transistor P3 114 is connected to a supply voltage node and a drain of fifth transistor P3 114 is connected to the QB node. A source of sixth transistor P4 116 is connected to a supply voltage node and a drain of sixth transistor P4 116 is connected to the Q node. Both a gate of fifth transistor P3 114 and a gate of sixth transistor P4 116 are connected to a pre-charge voltage bar node. In some embodiments, the supply voltage node supplies a voltage VDD, for example, 5 Volts, 3.3 Volts, 2.5 Volts, 1.8 Volts, 0.9 Volts, or the like. In addition, the pre-charge voltage bar node supplies an inverse of a pre-charge voltage signal. In some examples, fifth transistor P3 114 and sixth transistor P4 116 are also referred to as a pre-charge circuit or a set/reset circuit.

In examples, each of fifth transistor P3 114 and sixth transistor P4 116 is a pMOS transistor. However, it will be apparent to a person with an ordinary skill in the art after reading this this disclosure that other types of transistors, such as, a MOSFET, an nMOS transistor, or a CMOS transistor can be used for each of fifth transistor P3 114 and sixth transistor P4 116. In addition, each of fifth transistor P3 114 and sixth transistor P4 116 is symmetrical. That is, a source of each of fifth transistor P3 114 and sixth transistor P4 116 can be a drain, and a drain can be a source.

Continuing with FIG. 1, sense amplifier 100 further includes a seventh transistor P5 120 and an eighth transistor P6 122. A source of seventh transistor P5 120 is connected to a supply voltage node and a drain of seventh transistor P5 120 is connected to power node 118. A gate of seventh transistor P5 120 is connected to a pre-charge voltage bar node. A source of eighth transistor P6 122 is connected to a supply voltage node and a drain of eighth transistor P6 122 is connected to power node 118. A gate of eighth transistor P6 122 is connected to an output terminal of a signal level detector circuit 124. In some examples, seventh transistor P5 120 is also referred to as a first pull up transistor and eighth transistor P6 122 is also referred to as a second pull up transistor.

Signal level detector circuit 124 determines if one of a remaining voltage on the Q node and a remaining voltage on the QB node is below a reference voltage (for example, ½(VDD)). Signal level detector circuit 124, upon determining that one of the remaining voltage on the Q node and the remaining voltage on the QB node is below the reference voltage, provides an output signal at the output terminal which is provided to a gated of eighth transistor P6 122 and controls switching of eighth transistor P6 122.

In some examples, signal level detector circuit 124 comprises an AND logic circuit 128. AND logic circuit 128 determines a logical AND of the remaining voltages on the Q node and the QB node and provides an output signal. For example, when one of the remaining voltage on the Q node and the remaining voltage on the QB node is below the reference voltage, AND logic circuit 128 provides an output of a logic low. As shown in FIG. 1, a first input terminal of AND logic circuit 128 is connected to the Q node and a second input terminal of AND logic circuit 128 is connected to the QB node. In such examples, the output signal of AND logic circuit 124 is also referred to as an AND signal. In some examples, AND logic circuit 128 comprises an AND logic gate. However, other types of logic gates can be used to form AND logic circuit 128.

In examples, each of seventh transistor P5 120 and eighth transistor P6 122 is a pMOS transistor. However, it will be apparent to a person with an ordinary skill in the art after reading this this disclosure that other types of transistors, such as, a MOSFET, an nMOS transistor, or a CMOS transistor can be used for each of seventh transistor P5 120 and eighth transistor P6 122. In addition, each of seventh transistor P5 120 and eighth transistor P6 122 is symmetrical. That is, a source of each of seventh transistor P5 120 and eighth transistor P6 122 can be a drain, and a drain can be a source.

Sense amplifier 100 of FIG. 1 further includes a first comparator 126. A first input terminal of first comparator 126 is connected to the Q node and a second input terminal of first comparator 126 is connected to the QB node. First comparator 126 is triggered by a latch signal. When triggered, first comparator 126 compares the remaining voltage on the Q node with the remaining voltage on the QB node and provides an output signal (referred to as a DOUT signal) at an output terminal based on the comparison. The DOUT signal is indicative of the data stored in the memory cell.

Figure 2:
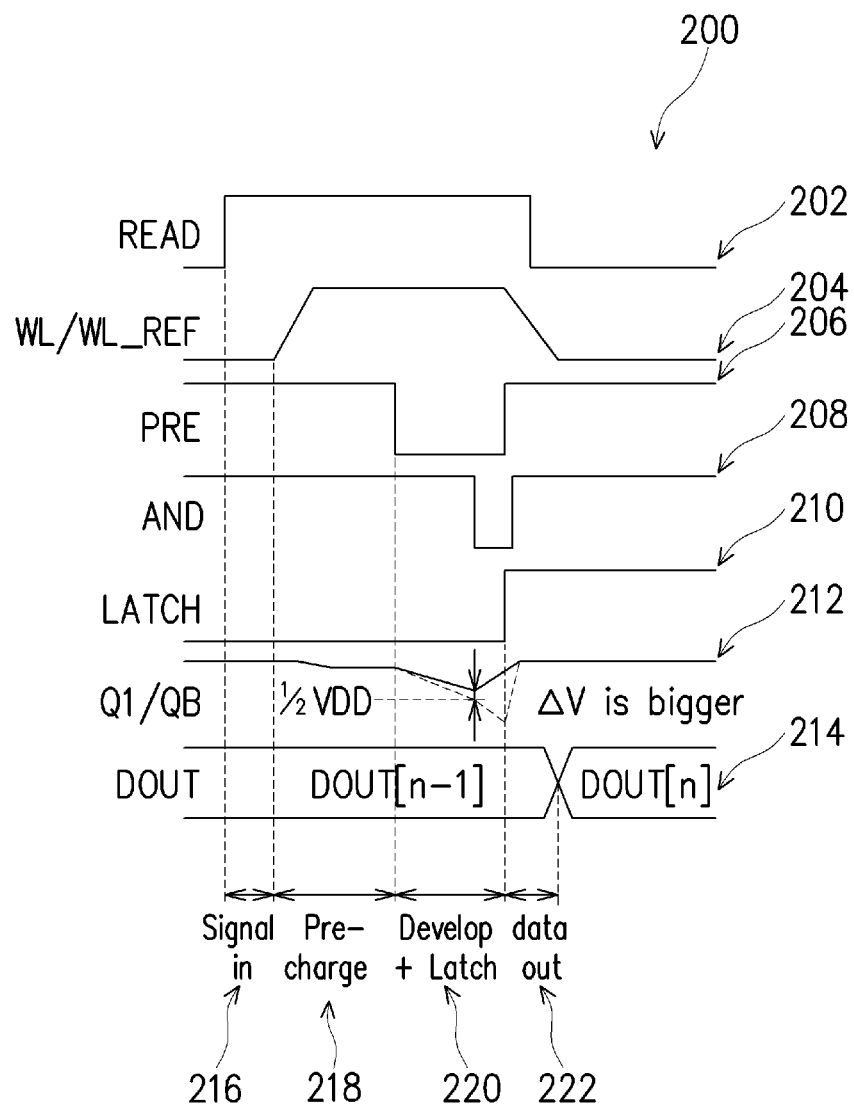
FIG. 2 is graph illustrating voltage levels of a sense amplifier of FIG. 1 in accordance with some embodiments.

FIG. 2 is a graph 200 illustrating signals of sense amplifier 100 during a read operation in accordance with some embodiments. For example, a first plot 202 of graph 200 illustrates the read signal (that is, a READ signal). A second plot 204 of graph 200 illustrates the word line/word line reference signal (that is, a WL/WL_REF signal). A third plot 206 of graph 200 illustrates the pre-charge signal (that is, a PRE signal). A fourth plot 208 of graph 200 illustrates the output signal of signal level detector circuit 124 (that is, the AND signal). A fifth plot 210 of graph 200 illustrates the latch signal (that is, a LATCH signal). A sixth plot 212 of graph 200 illustrates remaining voltage signals for the Q node and the QB node (that is, Q/QB signals). A seventh plot 214 of graph 200 illustrates the output signal of first comparator 126 (that is, the DOUT signal).

In examples, a read operation is triggered when the read signal rises to a logic high from a logic low. For example, and as shown in first plot 202 of graph 200, the READ signal changes from a logic low to a logic high when the read operation is initiated. A logic low is also referred to as a first logic value or logic 0 and a logic high is also referred to as a second logic value or logic 1. The read signal rising to a logic high also starts a pre-charging phase of sense amplifier 100.

After the read signal rises to a logic high, the word line signal or the word line reference signal also rises to a logic high. For example, and as shown in second plot 204 of graph 200, the WL/WL_REF signal also changes from a logic low to a logic high after the READ signal changes to a logic high. A first time gap between the READ signal rising to a logic high and the WL/WL_REF signal rising to a logic high is also referred to as signal-in period 216.

In addition, the pre-charge signal is at a logic high and it drops to a logic low at an end of the pre-charging phase. For example, as shown in third plot 206 of graph 200, after a second time gap from the WL/WL_REF signal rising to a logic high, the PRE signal drops to a logic low. The second time gap from the WL/WL_REF signal rising to a logic high and the PRE signal dropping to a logic low is also referred to as a pre-charge period 218. When the pre-charge signal is at a logic high, a pre-charge bar signal or a pre-charge bar signal node is at a logic low. This causes each of fifth transistor P3 114, sixth transistor P4 116, and seventh transistor P5 120 of sense amplifier 100 to switch on.

Switching on of seventh transistor P5 120 causes power node 118 to be connected to a supply voltage node (that is, to VDD, or a logic high). Thus, switching on of seventh transistor P5 123 causes each of a source of third transistor P1 110 and a source of fourth transistor P2 112 to be connected to the supply voltage node (that is, to VDD or a logic high). In addition, switching on of fifth transistor P3 114 causes the Q node to be connected to a supply voltage node (that is, to VDD or a logic high). Moreover, switching on of sixth transistor P4 116 causes the QB node to be connected to a supply voltage node (that is, to VDD or a logic high). Thus, in the pre-charging phase both the Q node and the QB node are at a logic high.

At end of the pre-charging phase, the pre-charge signal drops to a logic low. For example, as shown in third plot 206 of graph 200, after pre-charge period 218 from the WL/WL_REF signal rising to a logic high, the PRE signal drops to a logic low. When the pre-charge signal drops to a logic low, the pre-charge bar signal or the pre-charge bar signal node rises to a logic high. This causes each of fifth transistor P3 114, sixth transistor P4 116, and seventh transistor P5 120 to switch off. Switching off of seventh transistor P5 120 causes power node 118 to be disconnected from the supply voltage node which in turn causes the source of third transistor P1 110 and the source of fourth transistor P2 112 to be disconnected from the supply voltage node.

In addition, switching off of fifth transistor P3 114 causes the Q node to be disconnected from the supply voltage node. Moreover, switching off of sixth transistor P4 116 causes the QB node to be disconnected from the supply voltage node. This causes discharge of available voltages on both of the Q node and the QB node. For example, as shown in sixth plot 212 of graph 200, the PRE signal dropping to a logic low triggers gradual decline in the Q/QB signals due to PRE bar signal rising to a logic high and resulting in switching off of fifth transistor P3 114, sixth transistor P4 116, and seventh transistor P5 120.

Signal level detector circuit 124 (that is, AND logic circuit 128) determines whether the remaining voltage on one of the Q node and the Q node is below a reference voltage. For example, AND logic circuit 128 determines logical AND of the remaining voltages at the Q node and the QB node. When the remaining voltage at either the Q node or the QB node drops below the reference voltage (that is, ½(VDD)), an output signal of AND logic circuit 128 drops to a logic low. For example, and as shown in fourth plot 208 of graph 200, dropping of one of the Q/QB signals below the reference voltage (that is, ½(VDD)) causes the AND signal (that is, the output signal of AND logic circuit 128) to drop to a logic low. With the AND signal dropping to a logic low, and as shown in fifth plot 210 of graph 200, the LATCH signal rises to a logic high. A third time period between the PRE signal dropping to a logic low and the LATCH signal rising to a logic high is also referred to as develop and latch period 220.

The LATCH signal rising to a logic high triggers first comparator 126 to compare the remaining voltage on the Q node with the remaining voltage on the QB node and provide result of the comparison at a DOUT signal. The DOUT signal indicates whether the data on the memory cell is binary "1" or "0." For examples, and as shown in seventh plot 214 of graph 200, the LATCH signal rising to a logic high causes first comparator 126 to compare the remaining voltage on the Q node with the remaining voltage on the QB node and provide an output (that is, the DOUT) signal. A fourth time period between the LATCH signal rising to a logic high and first comparator 126 providing the DOUT signal is also referred to as a data-out period 222.

Thus, and in accordance with example embodiments, switching on of one of third transistor P1 110 and fourth transistor P2 112 is delayed until the remaining voltage on at least one of one the Q node and the QB node drops below the reference voltage. The delay provides for a bigger difference or a bigger gap in the remaining voltages at the Q node and the QB node which increases an accuracy of first comparator 126. In addition, the bigger gap increases an operating range of sense amplifier 100 to higher temperatures.

Continuing with graph 200 of FIG. 2, as shown in sixth plot 212, dropping of one of the Q/QB signals below the reference voltage (for example, ½(VDD)) also causes switching back on of one of third transistor P1 110 and fourth transistor P2 112 and subsequently switching on of other one of third transistor P1 110 and fourth transistor P2 112. This causes, as shown in sixth plot 212, the remaining voltages on both the Q node and the QB node to rise above the reference voltage which in turn causes, as shown in fourth plot 208, the AND signal to rise to a logic high and eighth transistor P6 122 to be switched off. This brings an end of the read cycle. Thus, as shown in first plot 202 and second plot 204, both the READ signal and WL/WL_REF signal drop to a logic low. In addition, and as shown in third plot 206, the PRE signal rises to a logic high. Moreover. The Q/QB signals also rise to a logic high.

Figure 3:
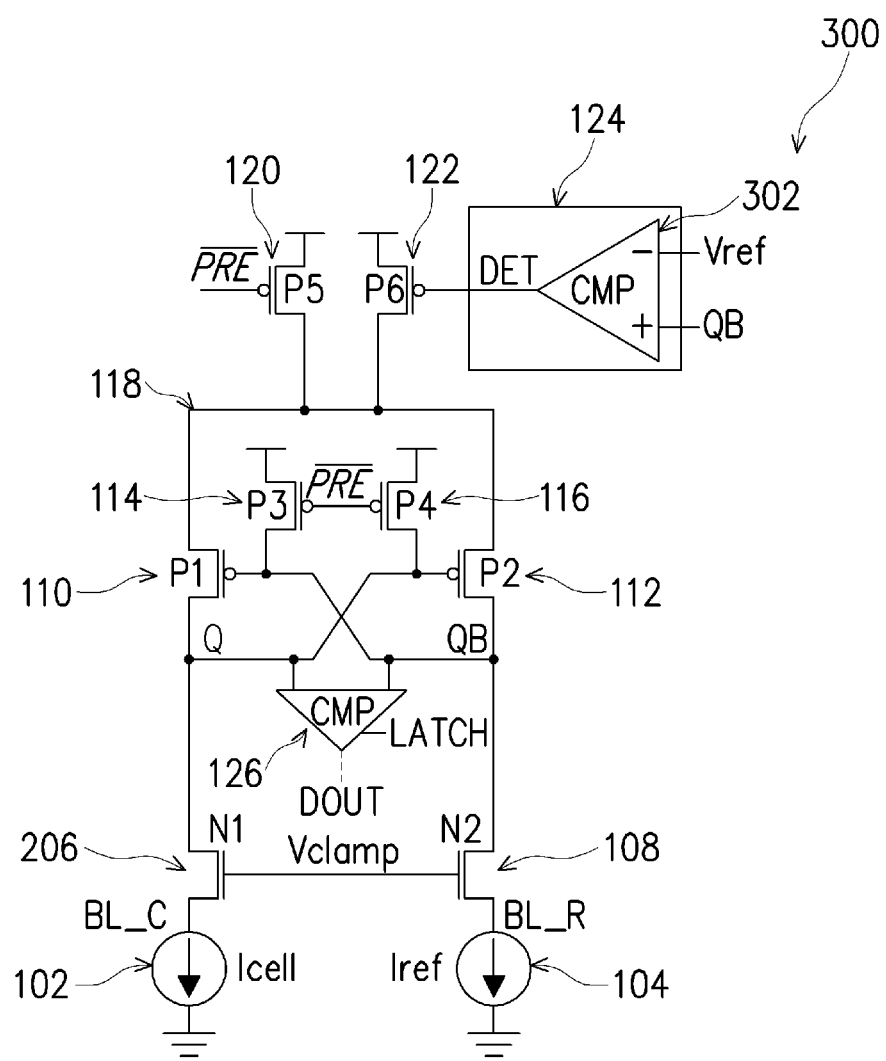
FIG. 3 illustrates a block diagram of another sense amplifier in accordance with some embodiments.

In some examples, signal level detector circuit 124 can include a different implementation than AND logic circuit 128. For example, FIG. 3 illustrates a block diagram of another sense amplifier 300 with another implementation of signal level detector circuit 124 in accordance with some embodiments. Signal level detector circuit 124 of sense amplifier 300 of FIG. 3 includes a second comparator 302. Second comparator 302 compares the remaining voltage on the QB node with the reference voltage of the reference voltage node and provides an output signal (that is, a DET signal) based on the comparison. It will be apparent to a person with the ordinary skill in the art after reading this disclosure that second comparator 302 can be implemented to compare the remaining voltage on the Q node with a reference voltage and provide the DET signal.

Sense amplifier 300 of FIG. 3 further includes cell current source Icell 102, reference current source Iref 104, first transistor N1 106, second transistor N2 108, third transistor P1 110, fourth transistor P2 112, fifth transistor P3 114, sixth transistor P4 116, seventh transistor P5 120, eighth transistor P6 122, and first comparator 126. In examples, each of first transistor N1 106 and second transistor N2 108 are nMOS transistors, while each of third transistor P1 110, fourth transistor P2 112, fifth transistor P3 114, sixth transistor P4 116, seventh transistor P5 120, and eighth transistor P6 122 are pMOS transistors. However, other types of transistors are within the scope of the disclosure.

As shown in FIG. 3, a first terminal of cell current source Icell 102 is connected to ground. In addition, a first terminal of reference current source Iref 104 is connected to ground. A drain of first transistor N1 106 is connected to a second terminal of cell current source Icell 102 and a source of first transistor N1 106 is connected to a Q node of sense amplifier 300. A drain of second transistor N2 108 is connected to a second terminal of reference current source Iref 104 and a source of second transistor N2 108 is connected to a QB node of sense amplifier 300. A gate of first transistor N1 106 is connected to a gate of second transistor N2 108. A clamping voltage Vclamp is applied to respective gates of first transistor N1 106 and second transistor N2 108.

A source of third transistor P1 110 is connected to power node 118 and a drain of third transistor P1 110 is connected to the Q node. A gate of third transistor P1 110 is connected to the QB node. A source of fourth transistor P2 112 is connected to power node 118 and a drain of fourth transistor P2 112 is connected to the QB node. A gate of fourth transistor P2 112 is connected to the Q node. A source of fifth transistor P3 114 is connected to a supply voltage node and a drain of fifth transistor P3 114 is connected to the QB node. A source of sixth transistor P4 116 is connected to a supply voltage node and a drain of sixth transistor P4 116 is connected to the Q node. Both a gate of fifth transistor P3 114 and a gate of sixth transistor P4 116 are connected to a pre-charge voltage bar node.

A source of seventh transistor P5 120 is connected to a supply voltage node and a drain of seventh transistor P5 120 is connected to power node 118. A gate of seventh transistor P5 120 is connected to a pre-charge voltage bar node. A source of eighth transistor P6 122 is connected to a supply voltage node and a drain of eighth transistor P6 122 is connected to power node 118. A gate of eighth transistor P6 122 is connected to an output terminal of second comparator 702. A first input terminal of second comparator 702 is connected to the QB node and a second input terminal of second comparator 702 is connected to the reference voltage node.

A first input terminal of first comparator 126 is connected to the Q node and a second input terminal of first comparator 126 is connected to the QB node. First comparator 126 is triggered by a latch signal. When triggered, first comparator 126 compares the remaining voltage on the Q node with the remaining voltage on the QB node and provides the DOUT signal at an output terminal based on the comparison. The DOUT signal is indicative of the data stored in the memory cell.

Figure 4:
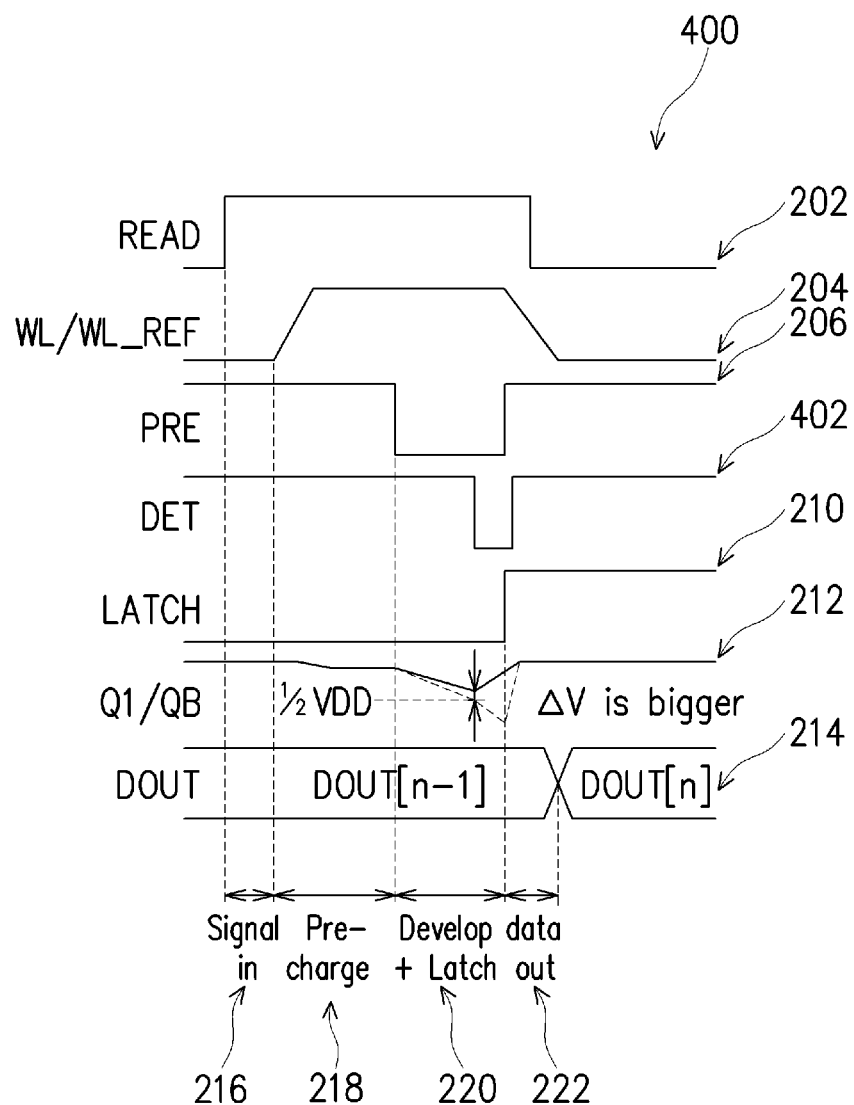
FIG. 4 is a graph illustrating voltage levels of the sense amplifier of FIG. 3 in accordance with some embodiments.

FIG. 4 is a graph 400 illustrating signals of sense amplifier 300 of FIG. 3 during a read operation in accordance with some embodiments. First plot 202 of graph 400 illustrates the READ signal, second plot 204 of graph 400 illustrates the WL/WL_REF signal, third plot 206 of graph 400 illustrates the PRE signal, fourth plot 402 of graph 400 illustrates the DET signal, fifth plot 210 of graph 400 illustrates the LATCH signal, sixth plot 212 of graph 400 illustrates the Q/QB signals, and seventh plot 214 of graph 400 illustrates the DOUT signal.

In examples, the read operation is triggered when the read signal rises to a logic high from a logic low. For example, and as shown in first plot 202 of graph 400, the READ signal changes from a logic low to a logic high when the read operation is initiated. After the read signal rises to a logic high, the word line signal or the word line reference signal also rises to a logic high. For example, as shown in second plot 204 of graph 400, the WL/WL_REF signal also changes from a logic low to a logic high after the READ signal changes to a logic high. The first time gap between the READ signal rising to a logic high and the WL/WL_REF signal rising to a logic high is also referred to as signal-in period 216.

In addition, a pre-charge signal is at a logic high and it drops to a logic low at the end of the pre-charge phase of the read operation. For example, as shown in third plot 206, after a second time gap from the WL/WL_REF signal rising to a logic high, the PRE signal drops to a logic low. The second time gap from the WL/WL_REF signal rising to a logic high and the PRE signal dropping to a logic low is also referred to as pre-charge period 218. When the pre-charge signal is at a logic high, the pre-charge bar signal or the pre-charge bar signal node is at a logic low. This causes each of fifth transistor P3 114, sixth transistor P4 116, and seventh transistor P5 120 of sense amplifier 300 to switch on.

Switching on of seventh transistor P5 120 causes power node 118 to be connected to a supply voltage node (that is, to VDD, or a logic high). Thus, switching on of seventh transistor P5 123 causes each of a source of third transistor P1 110 and a source of fourth transistor P2 112 to be connected to the supply voltage node (that is, to VDD or logic high). In addition, switching on of fifth transistor P3 114 causes the Q node to be connected to a supply voltage node (that is, to VDD or logic high). Moreover, switching on of sixth transistor P4 116 causes the QB node to be connected to a supply voltage node (that is, to VDD or logic high). Thus, in the pre-charging phase both the Q node and the QB node are at a logic high.

In example embodiments, and as shown in third plot 206 of graph 400, at end of the pre-charging phase, the PRE signal (that is, the pre-charge signal) drops to a logic low. When the pre-charge signal drops to a logic low, the pre-charge bar signal or the pre-charge bar signal node rises to a logic high. This causes each of fifth transistor P3 114, sixth transistor P4 116, and seventh transistor P5 120 to switch off. Switching off of seventh transistor P5 120 causes power node 118 to be disconnected from the supply voltage node which in turn causes the source of third transistor P1 110 and the source of fourth transistor P2 112 to be disconnected from the supply voltage node. In addition, switching off of fifth transistor P3 114 causes the Q node to be disconnected from the supply voltage node. Moreover, switching off of sixth transistor P4 116 causes the QB node to be disconnected from the supply voltage node. This causes discharge of available voltages on both of the Q node and the QB node. As shown in sixth plot 212 of graph 400, the PRE signal dropping to a logic low triggers gradual decline in the Q/QB signals due to PRE bar going high and switching off fifth transistor P3 114, sixth transistor P4 116, and seventh transistor P5 120.

Signal level detector circuit 124 (that is, second comparator 302) determines whether the remaining voltage on the QB node is below the reference voltage (that is, Vref). For example, second comparator 302 compares the remaining voltage on the QB node with the reference voltage (that is, Vref). When the remaining voltage the QB node drops below the reference voltage (that is, ½(VDD)), an output signal of second comparator 302 drops to a logic low. For example, as shown in fourth plot 402 of graph 400, the DET signal (that is, the output signal of second comparator 302) drops to a logic low when the QB signal drops below the reference voltage (that is, ½(VDD)). In addition, and as shown in fifth plot 210 of graph 400, the LATCH signal to rises to a logic high after the DET signal drops to a logic low. A third time period between the PRE signal dropping to a logic low and the LATCH signal rising to a logic high is also referred to as develop and latch period 220.

In addition, dropping of the output signal of second comparator 302 to a logic low causes the latch signal to rise to a logic high which triggers first comparator 126 to compare the remaining voltage on the Q node with the remaining voltage on the QB node and provide result of the comparison at a DOUT signal. The DOUT signal indicates whether the data on the memory cell is binary "1" or "0." For examples, and as shown in seventh plot 214 of graph 400, the LATCH signal rising to a logic high causes first comparator 126 to compare the remaining voltage on the Q node with the remaining voltage on the QB node and provide an output (that is, the DOUT) signal. A fourth time period between the LATCH signal rising to a logic high and first comparator 126 providing the DOUT signal is also referred to as a data-out period 222.

Thus, and in accordance with example embodiments, second comparator 302 delays switching on of one of third transistor P1 110 and fourth transistor P2 112 until the remaining voltage on at least one of one the Q node and the QB node drops below the reference voltage. The delay provides for a bigger difference or a bigger gap in the remaining voltages at the Q node and the QB node which increases an accuracy of first comparator 126. In addition, the bigger gap increases an operating range of sense amplifier 100 to higher temperatures.

Continuing with graph 400 of FIG. 4, as shown in sixth plot 212, dropping of the QB signal below the reference voltage (that is, ½(VDD)) also causes switching on of one of third transistor P1 110 and fourth transistor P2 112 and subsequently switching on of other one of third transistor P1 110 and fourth transistor P2 112. This causes, as shown in sixth plot 212 of graph 400, the remaining voltages on both the Q node and the QB node to rise above the reference voltage which in turn causes, as shown in fourth plot 208, the DET signal to rise to a logic high and eighth transistor P6 122 to be switched off. This brings an end of the read cycle. Thus, as shown in first plot 202 and second plot 204, both the READ signal and WL/WL_REF signal drop to a logic low. In addition, and as shown in third plot 206, the PRE signal rises to a logic high. Moreover. The Q/QB signals also rise to a logic high.

Figure 5:
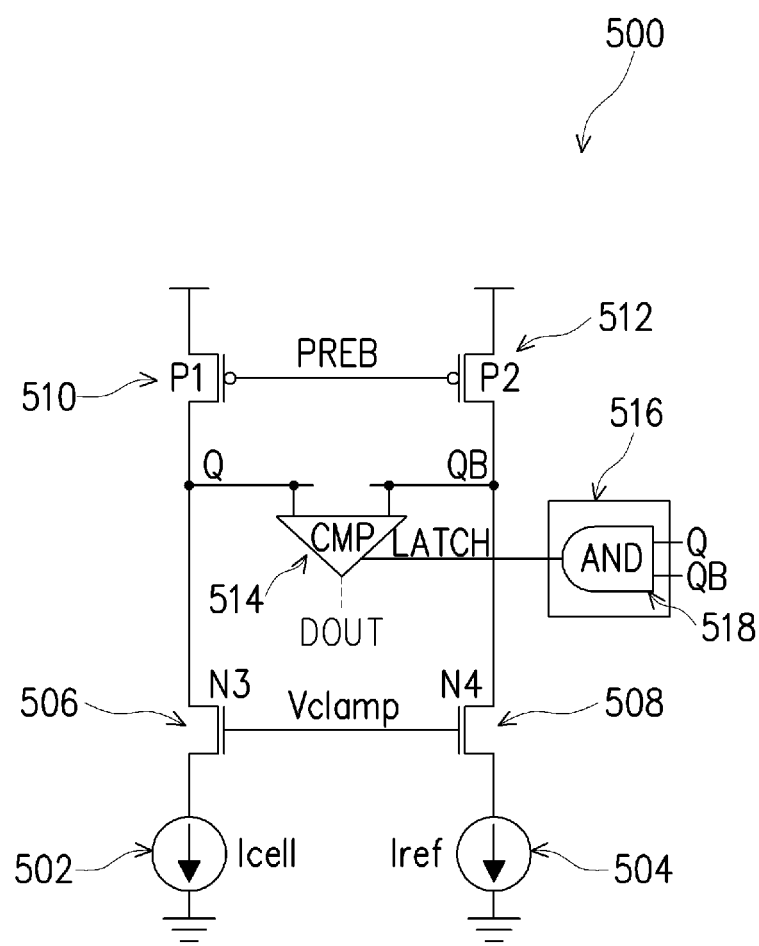
FIG. 5 is an example diagram of yet another sense amplifier in accordance with example embodiments.

FIG. 5 is an example diagram of another sense amplifier 500 in accordance with example embodiments. In some embodiments, sense amplifier 500 reads data stored on a memory cell of a cell array. In some examples, the memory cell can be a SRAM cell, a RRAM cell, a MRAM cell, a flash RAM cell, or the like. In some examples, sense amplifier 100 of FIG. 5 is a current mode sense amplifier.

As shown in FIG. 5, sense amplifier 500 includes a cell current source Icell 502 and a reference current source (Iref) 504. A first terminal of cell current source Icell 502 is connected to ground. Similarly, a first terminal of reference current source Iref 504 is connected to ground. In examples, a cell current Icell generated by cell current source Icell 502 has an amplitude corresponding to a programmed state of a memory cell being read. For example, if the data stored on the memory cell is binary "1," the cell current Icell may be a relatively high current. However, if the data stored on the memory cell is binary "0," the cell current Icell may be a relatively low current. In some embodiments, reference current source Iref 504 is another memory cell of a memory array including the memory cell that acts as cell current source 502. In some embodiments, the memory cell that acts as reference current source Iref 504 is not used in the memory array to store data (e.g., a dummy memory cell).

In addition, sense amplifier 500 includes a first transistor N3 506 and a second transistor N4 508. A drain of first transistor N3 506 is connected to a second terminal of Icell 502 and a source of first transistor N3 506 is connected to a Q node of sense amplifier 500. A drain of second transistor N4 508 is connected to a second terminal of Iref 504 and a source of second transistor N4 508 is connected to a QB node of sense amplifier 500. In examples, the Q node is complementary to the QB node.

A gate of first transistor N3 506 is connected to a gate of second transistor N4 508. A clamping voltage Vclamp is coupled to respective gates of first transistor N3 506 and second transistor N4 508 to set a cap or an upper limit on gate voltages of a bit line (cell side) and a reference bit line (reference side). In some embodiment, therefore, first transistor N3 506 and second transistor N4 508 are also referred to as clamping transistors as they prevent high voltages from damaging cell current source Icell 502 and reference current source Iref 504.

In examples, each of first transistor N3 506 and second transistor N4 508 is an nMOS transistor. However, it will be apparent to a person with an ordinary skill in the art after reading this this disclosure that other types of transistors, such as, a MOSFET, a pMOS transistor, or a CMOS transistor can be used for each of first transistor N3 506 and second transistor N4 508. In addition, each of first transistor N3 506 and second transistor N4 508 is symmetrical. That is, a source of each of first transistor N3 506 and second transistor N4 508 can be a drain, and a drain can be a source.

Continuing with FIG. 5, sense amplifier 500 further includes a third transistor P1 510 and a fourth transistor P2 512. A source of third transistor P1 510 is connected to a supply voltage node and a drain of third transistor P1 510 is connected to the Q node. A source of fourth transistor P2 512 is connected to a supply voltage node and a drain of fourth transistor P2 512 is connected to the QB node. A gate of fourth transistor P2 512 and a gate of third transistor 510 is connected to a pre-charge signal bar node. The QB node is complementary to the Q node. In some examples, the Q node is also referred to as a first node in this disclosure. Similarly, the QB node is also referred to as a second node in this disclosure.

In examples, each of third transistor P1 510 and fourth transistor P2 512 is a pMOS transistor. However, it will be apparent to a person with an ordinary skill in the art after reading this this disclosure that other types of transistors, such as, a MOSFET, an nMOS transistor, or a CMOS transistor can be used for each of third transistor P1 510 and fourth transistor P2 512. In addition, each of third transistor P1 510 and fourth transistor P2 512 is symmetrical. That is, a source of each of third transistor P1 510 and fourth transistor P2 512 can be a drain, and a drain can be a source. In some examples, third transistor P1 510 and fourth transistor P2 512 form a pre-charge circuit of sense amplifier 500. In other examples, third transistor P1 510 and fourth transistor P2 512 form a amplifier circuit of sense amplifier 500.

Sense amplifier 500 of FIG. 5 further includes a first comparator 514. A first input terminal of first comparator 514 is connected to the Q node and a second input terminal of first comparator 514 is connected to the QB node. First comparator 514 is triggered by a latch signal. When triggered, first comparator 514 compares a remaining voltage on the Q node with a remaining voltage on the QB node and provides an output (that is, a DOUT signal) at an output terminal based on the comparison. The DOUT signal indicates whether the data on the memory cell is binary "1" or "0."

As shown in FIG. 5, the latch signal is provided by a signal level detector circuit 516. Signal level detector circuit 516 determines if one of a remaining voltage on the Q node and a remaining voltage on the QB node drops below a reference voltage. Signal level detector circuit 516, upon determining that the remaining voltage on the Q node or the remaining voltage on the QB node falls below the reference voltage, provides the latch signal. The latch signal triggers first comparator 514 to compare the remaining voltage on the Q node with the remaining voltage on the QB node.

In some examples, signal level detector circuit 516 includes a AND logic circuit 518. A first input terminal of AND logic circuit 518 is connected to the Q node and a second input terminal of AND logic circuit 518 is connected to the QB node. An output terminal of AND logic circuit 518 is connected to first comparator 514. AND logic circuit 518 determines a logical AND of the remaining voltages on the Q node and the QB node and provides an output of a logic low when one of the remaining voltage on the Q node with the remaining voltage on the QB node falls below the reference voltage. An output signal of AND logic circuit 518 is also referred to as an AND signal. In some examples, AND logic circuit 518 comprises an AND logic gate. However, other types of logic gates can be used to form AND logic circuit 518.

Figure 6:
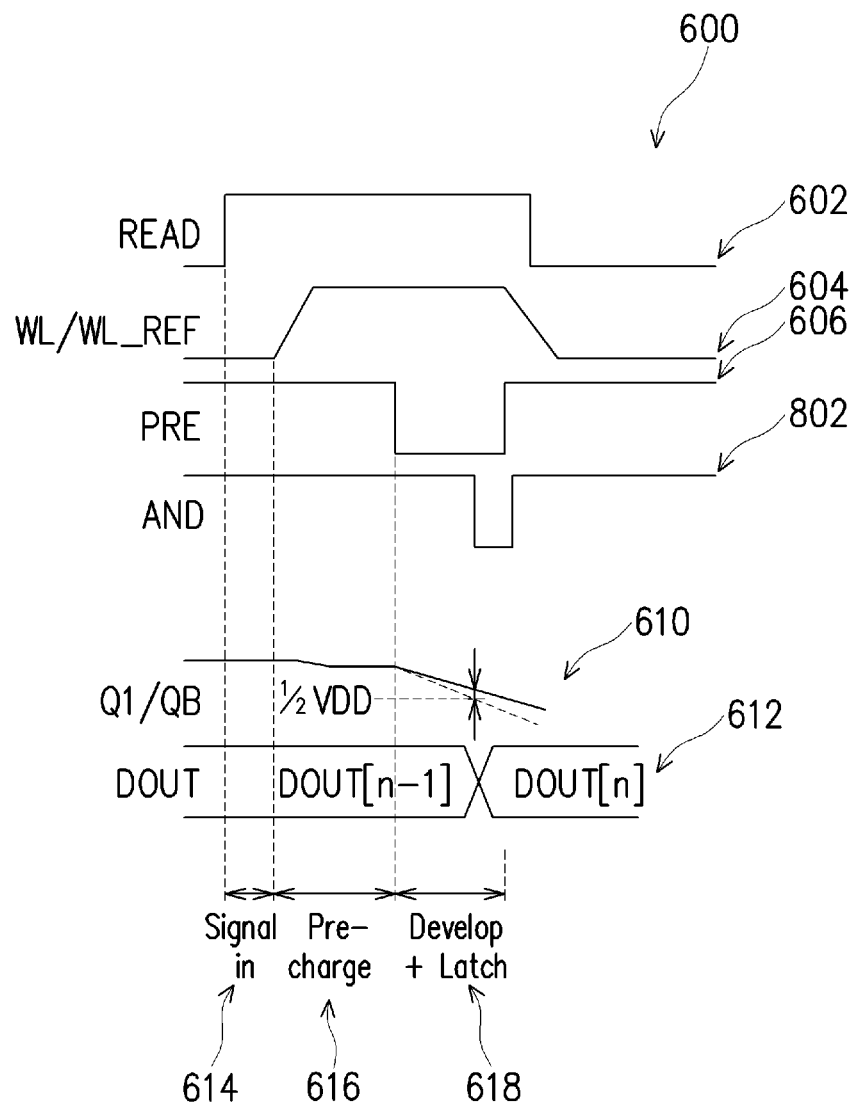
FIG. 6 is graph illustrating voltage levels of the sense amplifier of FIG. 5 in accordance with some embodiments.

FIG. 6 is a graph 600 illustrating signals of sense amplifier 500 during a read operation in accordance with some embodiments. For example, first plot 602 of graph 600 of FIG. 6 illustrates the read signal (that is, a READ signal). Second plot 604 of graph 600 illustrates the word line/word line reference signal (that is, the WL/WL_REF signal). Third plot 606 of graph 600 illustrates the pre-charge signal (that is, the PRE signal). Fourth plot 608 of graph 600 illustrates an output signal of signal level detector circuit 516 (that is, the AND signal). Fifth plot 610 of graph 600 illustrates the remaining voltages on the Q node and the QB node (that is, the Q/QB signals). Sixth plot 612 of graph 600 illustrates the output signal of comparator 514 (that is, the DOUT signal).

In examples, a read operation is triggered when a read signal rises to a logic high from a logic low. As shown in first plot 602 of graph 600 of FIG. 6, the READ signal changes from a logic low to a logic high when a read operation is initiated. The read signal rising to a logic high starts a pre-charging phase of sense amplifier 500. After the read signal rises to a logic high, a word line signal or a word line reference signal also rises to a logic high. For example, and as shown in second plot 604 of graph 600, the WL/WL_REF signal also changes from a logic low to a logic high after the READ signal changes to a logic high. The first time gap between the READ signal rising to a logic high and the WL/WL_REF signal rising to a logic high is also referred to as signal-in period 614.

In addition, and as shown in fifth plot 610 of graph 600, in signal-in period, the pre-charge signal is at a logic high. When the pre-charge signal is at a logic high, a pre-charge bar signal or a pre-charge bar node is a logic low. This causes each of third transistor P1 510 and fourth transistor P2 512 of sense amplifier 500 to switch on.

Switching on of third transistor P1 510 causes the Q node to be connected to a supply voltage node (that is, to VDD or a logic high). Moreover, switching on of fourth transistor P2 512 causes the QB node to be connected to a supply voltage node (that is, to VDD or a logic high). Thus, in the pre-charging phase both the Q node and the QB node are at a logic high.

At end of the pre-charging phase, the pre-charge signal drops to a logic low. For example, and as shown in third plot 606 of graph 600, after a second time gap from the WL/WL_REF signal rising to a logic high, the PRE signal drops to a logic low. The second time gap from the WL/WL_REF signal rising to a logic high and the PRE signal dropping to a logic low is also referred to as a pre-charge period 616.

When the pre-charge signal is at a logic low, the pre-charge bar signal or the pre-charge bar node rises to a logic high. This causes each of third transistor P1 510 and fourth transistor P2 512 to switch off. In addition, switching off of third transistor P1 510 causes the Q node to be disconnected from the supply voltage node. Moreover, switching off of fourth transistor P2 512 causes the QB node to be disconnected from the supply voltage node. This causes discharge of available voltages on both of the Q node and the QB node. For example, as shown in fifth plot 610 of graph 600 of FIG. 6, the PRE signal dropping to a logic low triggers gradual decline in the Q/QB signals.

Signal level detector circuit 516 (that is, AND logic circuit 518) determines if the remaining voltage on one of the Q node and the Q node is below a reference voltage. When the remaining voltage at either the Q node or the QB node drops below the reference voltage (for example, ½(VDD)), an output signal of AND logic circuit 518 (that is, the latch signal) drops to a logic low. For example, as shown in fourth plot 608 of graph 600, dropping of one of the Q/QB signals below the reference voltage (that is, ½(VDD)) causes the AND signal to drop to a logic low. The AND signal dropping to a logic low, as shown in sixth plot 612 of graph 600, triggers first comparator 514 to compare the remaining voltage on the Q node with the remaining voltage on the QB node and provide result of the comparison at a DOUT signal. For example, as shown in sixth plot 612 of graph 600, the DOUT signal indicates whether the data on the memory cell is binary "1" or "0."

A third time period between the PRE signal dropping to a logic low and the AND signal rising to a logic high is also referred to as develop and latch period 618. Rising of the AND signal to a logic high also triggers end of a read cycle. Thus, as shown in first plot 602 and second plot 604 of graph 600, both the READ signal and WL/WL_REF signal drop to a logic low. In addition, and as shown in third plot 606, the PRE signal rises to a logic high. Moreover, the Q/QB signals also rise to a logic high.

Thus, and in accordance with example embodiments, comparing of the remaining voltages on the Q node and the QB node is delayed until the remaining voltage on either the Q node of the QB node drops below a reference voltage (for example, ½(VDD)). The delay provides for a greater difference or a bigger gap in the remaining voltages at the Q node and the QB node which increases an accuracy of first comparator 514 and sense amplifier 500. In addition, the bigger gap increases an operating range of sense amplifier 500 to higher temperatures.

Figure 7:
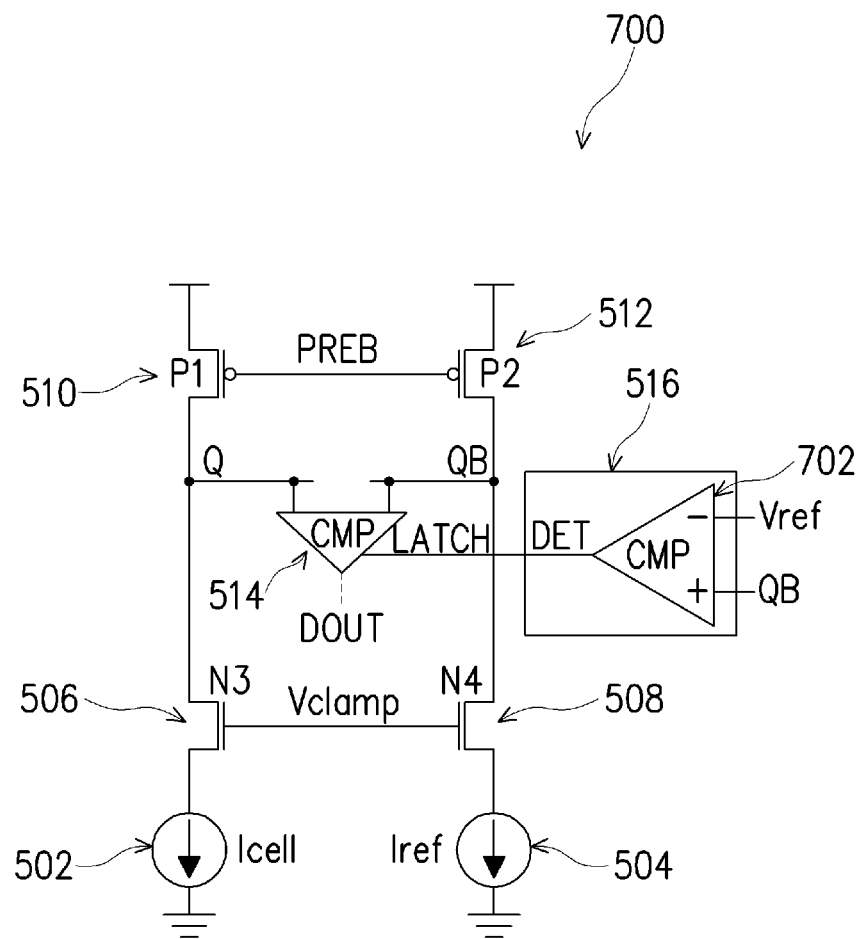
FIG. 7 illustrates a block diagram of yet another sense amplifier in accordance with some embodiments.

FIG. 7 illustrates a block diagram of a sense amplifier 700 with another implementation of signal level detector circuit 516 in accordance with some embodiments. Signal level detector circuit 516 of sense amplifier 700 of FIG. 7 includes a second comparator 702. Second comparator 702 compares a remaining voltage on the QB node with the reference voltage of the reference voltage node and provides an output signal (that is, a DET signal) based on the comparison. The DET signal is at a logic high when the remaining voltage on the QB node is above the reference voltage and drops to a logic low when the remaining voltage on the QB node drops below the reference voltage. It will be apparent to a person with the ordinary skill in the art that second comparator 702 can compare the remaining voltage on the Q node with the reference voltage and provide the DET signal. In some examples, second comparator 702 is an amplifier, for example, an operation amplifier.

Sense amplifier 700 of FIG. 7 further includes cell current source Icell 502, reference current source Iref 504, first transistor N3 506, second transistor N4 508, third transistor P1 510, fourth transistor P2 512, and first comparator 514. In examples, each of first transistor N3 506 and second transistor N4 508 are nMOS transistors, while each of third transistor P1 510 and fourth transistor P2 512 are pMOS transistors. However, other types of transistors are within the scope of the disclosure.

A first terminal of cell current source Icell 502 is connected to ground. Similarly, a first terminal of reference current source Iref 504 is connected to ground. A drain of first transistor N3 506 is connected to a second terminal of Icell 502 and a source of first transistor N3 506 is connected to the Q node. A drain of second transistor N4 508 is connected to a second terminal of Iref 504 and a source of second transistor N4 508 is connected to the QB node. A gate of first transistor N3 506 is connected to a gate of second transistor N4 508. A clamping voltage Vclamp is coupled to respective gates of first transistor N3 506 and second transistor N4 508 to set a cap or an upper limit on gate voltages of a bit line (cell side) and a reference bit line (reference side).

A source of third transistor P1 510 is connected to a supply voltage node and a drain of third transistor P1 510 is connected to the Q node. A source of fourth transistor P2 512 is connected to a supply voltage node and a drain of fourth transistor P2 512 is connected to the QB node. A gate of fourth transistor P2 512 and a gate of third transistor 510 is connected to a pre-charge signal bar node.

A first input terminal of first comparator 514 is connected to the Q node and a second input terminal of first comparator 514 is connected to the QB node. First comparator 514 is triggered by a latch signal. When triggered, comparator 514 compares the remaining voltage on the Q node with the remaining voltage on the QB node and provides an output (that is, the DOUT signal) at an output terminal based on the comparison. The DOUT signal indicates whether the data on the memory cell is binary "1" or "0."

As shown in FIG. 7, the latch signal is provided by second comparator 702. Second comparator 702 determines if the remaining voltage on the QB node drops below the reference voltage (that is, Vref). Second comparator 702, upon determining that the remaining voltage on the QB node drops below the reference voltage, provides the latch signal. The latch signal triggers first comparator 514 to compare the remaining voltage on the Q node with the remaining voltage on the QB node.

A first input terminal of second comparator 702 is connected to a reference voltage node and a second input terminal of circuit 518 is connected to the QB node. An output terminal of second comparator 702 is connected to first comparator 514. Second comparator compares the remaining voltage on the QB node with the reference voltage (that is, Vref) and provides an output of a logic low when one of the remaining voltage on the QB node drops below the reference voltage. An output signal of second comparator 702 is also referred to as an DET signal.

Figure 8:
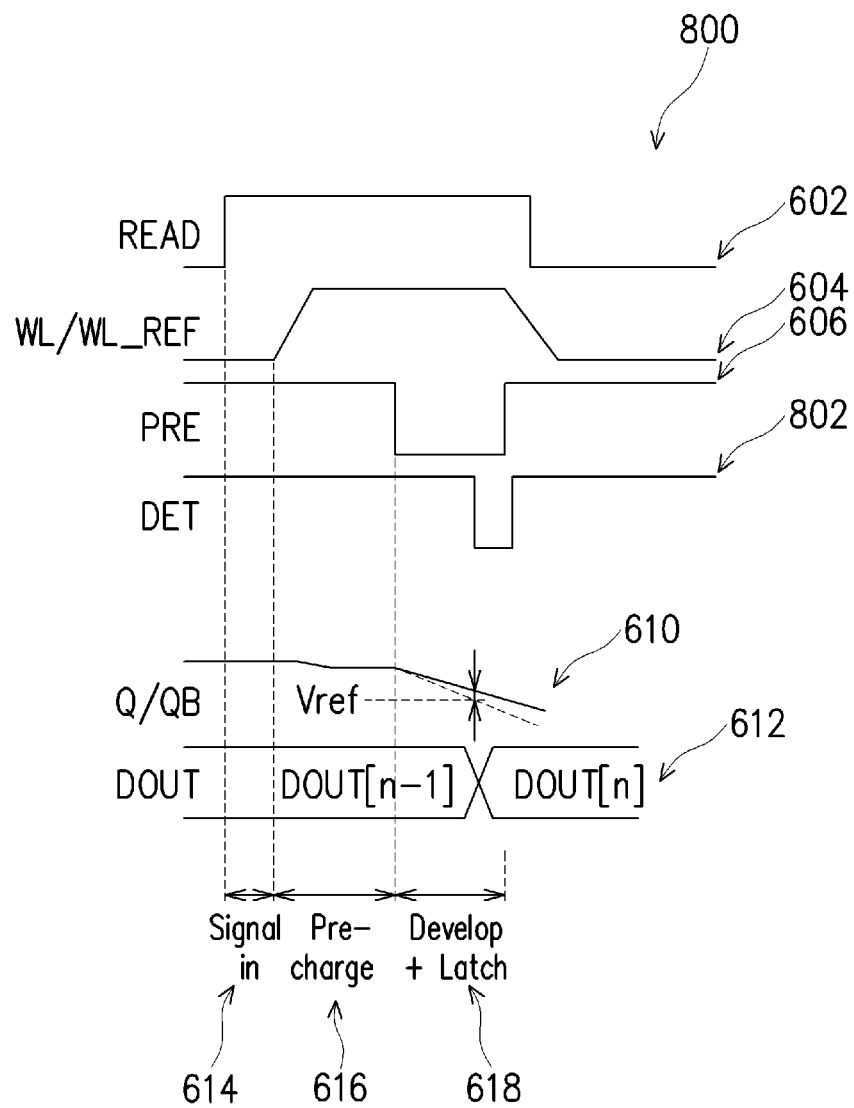
FIG. 8 is graph illustrating voltage levels of the sense amplifier of FIG. 7 in accordance with some embodiments.

FIG. 8 is a graph 800 illustrating signals of sense amplifier 700 during a read operation in accordance with some embodiments. For example, first plot 602 of graph 800 of FIG. 8 illustrates the read signal (that is, the READ signal). Second plot 604 of graph 800 illustrates the word line/word line reference signal (that is, the WL/WL_REF signal). Third plot 606 of graph 800 illustrates the pre-charge signal (that is, the PRE signal). Fourth plot 802 of graph 800 illustrates an output signal of second comparator 702 (that is, the AND signal). Fifth plot 610 of graph 800 illustrates the remaining voltages on the Q node and the QB node (that is, Q/QB signals). Sixth plot 612 of graph 800 illustrates the output signal of comparator 514 (that is, the DOUT signal).

In examples, the read operation is triggered when the read signal rises to a logic high from a logic low. As shown in first plot 602 of graph 800 of FIG. 8, the READ signal changes from a logic low to a logic high when a read operation is initiated. The read signal rising to a logic high starts the pre-charging phase of sense amplifier 700. After the read signal rises to a logic high, the word line signal or the word line reference signal also rises to a logic high. For example, and as shown in second plot 604 of graph 800, the WL/WL_REF signal also changes from a logic low to a logic high after the READ signal changes to a logic high. The first time gap between the READ signal rising to a logic high and the WL/WL_REF signal rising to a logic high is also referred to as signal-in period 614.

In addition, and as shown in fifth plot 610 of graph 800, in signal-in period, the pre-charge signal is at a logic high. When the pre-charge signal is at a logic high, the pre-charge bar signal or the pre-charge bar node is at a logic low. This causes each of third transistor P1 510 and fourth transistor P2 512 of sense amplifier 700 to switch on.

Switching on of third transistor P1 510 causes the Q node to be connected to a supply voltage node (that is, to VDD or a logic high). Moreover, switching on of fourth transistor P2 512 causes the QB node to be connected to a supply voltage node (that is, to VDD or a logic high). Thus, in the pre-charging phase both the Q node and the QB node are at a logic high.

At end of the pre-charging phase, the pre-charge signal drops to a logic low. For example, and as shown in third plot 606 of graph 800, after a second time gap from the WL/WL_REF signal rising to a logic high, the PRE signal drops to a logic low. The second time gap from the WL/WL_REF signal rising to a logic high and the PRE signal dropping to a logic low is also referred to as pre-charge period 616.

When the pre-charge signal is at a logic low, the pre-charge bar signal or the pre-charge bar node rises to a logic high. This causes each of third transistor P1 510 and fourth transistor P2 512 to switch off. In addition, switching off of third transistor P1 510 causes the Q node to be disconnected from the supply voltage node. Moreover, switching off of fourth transistor P2 512 causes the QB node to be disconnected from the supply voltage node. This causes discharge of available voltages on both of the Q node and the QB node. For example, as shown in fifth plot 610 of graph 800 of FIG. 8, the PRE signal dropping to a logic low triggers gradual decline in the Q/QB signals.

Second comparator 702 determines if the remaining voltage on the QB node is below the reference voltage (that is, ½(VDD)). When the remaining voltage at the QB node drops below the reference voltage (that is, ½(VDD)), the output signal of second comparator 702 (that is, the DET signal) drops to a logic low. For example, as shown in fourth plot 802 of graph 800, dropping of the QB signals below the reference voltage (that is, ½(VDD)) causes the DET signal to drop to a logic low. The DET signal dropping to a logic low, as shown in sixth plot 612 of graph 800, triggers first comparator 514 to compare the remaining voltage on the Q node with the remaining voltage on the QB node and provide result of the comparison at a DOUT signal. For example, as shown in sixth plot 612 of graph 600, the DOUT signal indicates whether the data on the memory cell is binary "1" or "0."

A third time period between the PRE signal dropping to a logic low and the DET signal rising to a logic high is also referred to as develop and latch period 618. Rising of the DET signal to a logic high also triggers end of a read cycle. Thus, as shown in first plot 602 and second plot 604 of graph 800, both the READ signal and WL/WL_REF signal drop to a logic low. In addition, and as shown in third plot 606, the PRE signal rises to a logic high. Moreover, the Q/QB signals also rise to a logic high.

Thus, and in accordance with example embodiments, comparing of the remaining voltages on the Q node and the QB node is delayed until the remaining voltage on either the Q node of the QB node drops below a reference voltage (for example, ½(VDD)). The delay provides for a greater difference or a bigger gap in the remaining voltages at the Q node and the QB node which increases an accuracy of first comparator 514 and sense amplifier 500. In addition, the bigger gap increases an operating range of sense amplifier 500 to higher temperatures.

Figure 9:
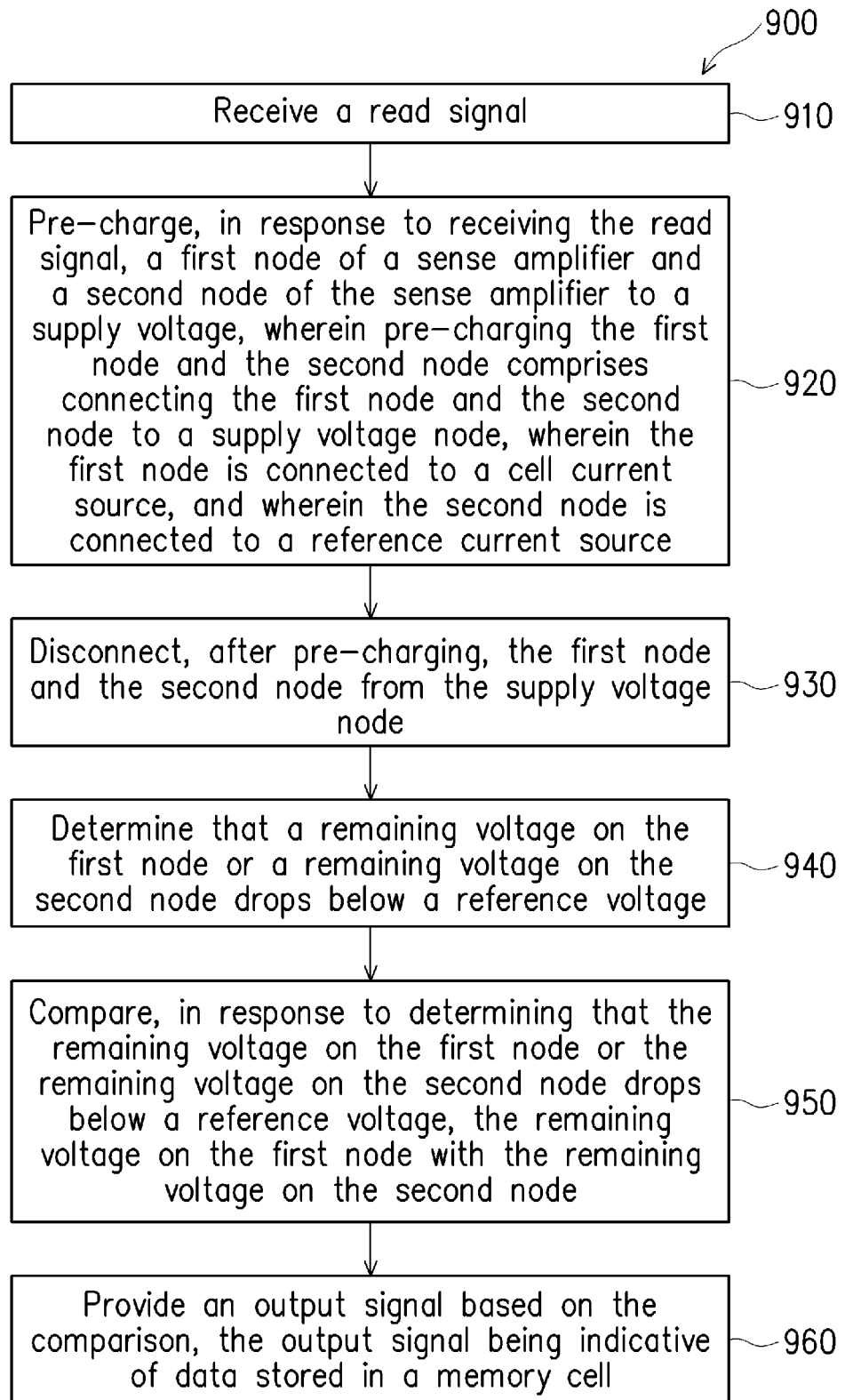
FIG. 9 is a flow diagram illustrating an example method for operating a latch in accordance with some embodiments.

FIG. 9 is a flow diagram illustrating a method 900 for reading data from a memory cell in accordance with some embodiments. For example, method 900 may be implemented in sense amplifiers 100 and 500 described with reference to FIGS. 1-8. In addition, steps of method 900 may be stored as instructions in a memory device or in a computer readable medium which may be executed by a processor to implement method 900. The computer readable medium may be a non-transitory computer readable medium.

At block 910 of method 900, a read signal is received. For example, a read signal is received to initiate reading of data stored in a memory cell of a memory device. In some examples, the read signal rises to a logic high to initiate a read operation.

At block 920 of method 900, in response to receiving the read signal, a first node (that is, the Q node) of sense amplifier 100 and a second node (that is, the QB node) of sense amplifier 100 are pre-charged to a supply voltage. Pre-charging the first node (that is, the Q node) and the second node (that is, the QB node) includes connecting the first node (that is, the Q node) and the second node (that is, the QB node) to a supply voltage node. The first node (that is, the Q node) is connected to cell current source Icell 102. The second node (that is, the QB node) is connected to reference current source Iref 104.

In some examples, the Q node is connected to the supply voltage by switching on fifth transistor P3 114 and the QB node is connected to the supply voltage by switching on sixth transistor P4 116. In addition, the Q node is connected to cell current source Icell 102 through first transistor N1 106. The Q node is connected to reference current source Iref 104 through second transistor N2 108. In some examples, the Q node and the QB node are pre-charged in response to a pre-charge signal rising to a logic high.

At block 930 of method 900, after pre-charging, the first node (that is, the Q node) and the second node (that is, the QB node) are disconnected from the supply voltage node. For example, the Q node is disconnected from the supply voltage by switching off fifth transistor P3 114 and the QB node is disconnected from the supply voltage by switching off sixth transistor P4 116. In some examples, the Q node and the QB node are disconnected from the supply voltage node in response to the pre-charge signal dropping to a logic low.

At block 940 of method 900, it is determined whether a remaining voltage on the first node (that is, the Q node) or a remaining voltage on the second node (that is, the QB node) drops below a reference voltage. For example, signal level detector circuit 124 determines whether a remaining voltage on the first node (that is, the Q node) or a remaining voltage on the second node (that is, the QB node) drops below a reference voltage.

At block 950 of method 900, in response to determining that the remaining voltage on the first node (that is, the Q node) or the remaining voltage on the second node (that is, the QB node) dropped below a reference voltage, the remaining voltage on the first node (that is, the Q node) is compared with the remaining voltage on the second node (that is, the Q node). In examples, first comparator 126 compares the remaining voltage on the Q node with the remaining voltage on the QB node.

At block 960 of method 900, an output signal is provided based on the comparison. The output signal is indicative of data stored in a memory cell. For example, comparator provides the DOUT signal based on comparing the remaining voltage on the Q node with the remaining voltage on the QB node. The DOUT signal is indicative of whether the data stored in the memory cell is a bit value 1 or a bit value 0.

In accordance with example embodiments, a sense amplifier comprises: a first invertor, wherein a first terminal of the first invertor is connected to a power node, and wherein a second terminal of the first invertor is connected to a cell current source; a second invertor, wherein a first terminal of the second invertor is connected to the power node, wherein a second terminal of the second invertor is connected to a reference current source, and wherein the first invertor is cross coupled with the second invertor at a first node and a second node; a pre-charge circuit connected to the first node and the second node; a first pull up transistor connected between a supply voltage node and the power node; a second pull up transistor connected between the supply voltage node and the power node; and a signal level detector circuit connected to the second pull up transistor, wherein the signal level detector circuit switches on the second pull up transistor when a remaining voltage on one of the first node and the second node is below a reference voltage.

In example embodiments, a circuit comprises: a first transistor, wherein a source of the first transistor is connected to a first node, wherein a drain of the first transistor is connected to a cell current source; a second transistor, wherein a source of the second transistor is connected to a second node, wherein a drain of the second transistor is connected to a reference current source; a third transistor, wherein a source of the third transistor is connected to a supply voltage node, wherein a drain of the third transistor is connected to the first node; a fourth transistor, wherein a source of the fourth transistor is connected to the supply node, wherein a drain of the fourth transistor is connected to the second node; a comparator, wherein a first input terminal of the comparator is connected to the first node, wherein a second input terminal of the comparator is connected to the second node; and a signal level detector circuit, wherein an output terminal of the signal level detector circuit connected to the comparator, wherein the signal level detector circuit triggers the comparator to compare a remaining voltage of the first node with a remaining voltage of the second node in response to at least one of the following: the remaining voltage of the first node is less than a predetermined voltage, and the remaining voltage of the second node is less than the predetermined reference level.

In accordance with example embodiments, a method of reading data from a memory cell, comprises: receiving a read signal; pre-charging, in response to receiving the read signal, a first node of a sense amplifier and a second node of the sense amplifier to a supply voltage, wherein pre-charging the first node and the second node comprises connecting the first node and the second node to a supply voltage node, wherein the first node is connected to a cell current source, and wherein the second node is connected to a reference current source; disconnecting, after pre-charging, the first node and the second node from the supply voltage node; determining that a remaining voltage on the first node or a remaining voltage on the second node drops below a reference voltage; comparing, in response to determining that the remaining voltage on the first node or the remaining voltage on the second node drops below a reference voltage, the remaining voltage on the first node with the remaining voltage on the second node; and providing an output signal based on the comparison, the output signal being indicative of data stored in a memory cell.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier, comprising:
    a first invertor, wherein a first terminal of the first invertor is connected to a power node, and wherein a second terminal of the first invertor is connected to a cell current source;
    a second invertor, wherein a first terminal of the second invertor is connected to the power node, wherein a second terminal of the second invertor is connected to a reference current source, and wherein the first invertor is cross coupled with the second invertor at a first node and a second node;
    a pre-charge circuit connected to the first node and the second node;
    a first pull up transistor connected between a supply voltage node and the power node;
    a second pull up transistor connected between the supply voltage node and the power node; and
    a signal level detector circuit connected to the second pull up transistor, wherein the signal level detector circuit switches on the second pull up transistor when a remaining voltage on one of the first node and the second node is below a reference voltage.

2. The sense amplifier of claim 1, further comprising a first comparator, wherein a first input terminal of the first comparator is connected to the first node and a second input terminal of the first comparator is connected to the second node.

3. The sense amplifier of claim 2, wherein the first comparator compares a remaining voltage of the first node with a remaining voltage of the second node and provides an output signal based on the comparison, the output signal being indicative of data stored in a memory cell associated with the cell current source.

4. The sense amplifier of claim 3, wherein the comparison of the remaining voltage of the first node with the remaining voltage of the second node is delayed until the remaining potential of the second node drops below the reference voltage.

5. The sense amplifier of claim 1, wherein the signal level detector circuit comprises an AND logic circuit, wherein a first input terminal of the AND logic circuit is connected to the first node, wherein a second input terminal of the AND logic circuit is connected to the second node, and wherein an output terminal of the AND logic circuit is connected to a gate of the second pull up transistor.

6. The sense amplifier of claim 1, wherein the signal level detector circuit comprises a second comparator, wherein a first input terminal of the second comparator is connected to the second node, wherein a second input terminal of the second comparator is connected to a reference voltage node, and wherein an output terminal of the second comparator is connected to a gate of the second pull up transistor.

7. The sense amplifier of claim 6, wherein the second comparators compares a remaining voltage on the second node with a reference voltage of the reference voltage node and switches on the second pull up transistor when the remaining voltage on the second node drops below the reference voltage of the reference node.

8. The sense amplifier of claim 1, wherein the first invertor comprises a first transistor and a third transistor, wherein a drain of the first transistor is connected to the cell current source, wherein a source of the first transistor is connected to the Q node, wherein a drain of the third transistor is connected to the Q node, and wherein a source of the third transistor is connected to the power node.

9. The sense amplifier of claim 1, wherein the second invertor comprises a second transistor and a fourth transistor, wherein a drain of the second transistor is connected to the reference current source, wherein a source of the second transistor is connected to the QB node, wherein a drain of the fourth transistor is connected to the QB node, and wherein a source of the fourth transistor is connected to the power node.

10. The sense amplifier of claim 1, wherein the pre-charge circuit comprises a fifth transistor and a sixth transistor, wherein a source of the fifth transistor is connected to the supply voltage node, wherein a drain of the fifth transistor is connected to the first node, wherein a source of the sixth transistor is connected to the supply voltage node, and wherein a drain of the fifth transistor is connected to the second node.

11. The sense amplifier of claim 10, wherein when switched on the fifth transistor and the sixth transistor charge the first node and the second node to a supply voltage.

12. The sense amplifier of claim 1, wherein a gate of the first pull up transistor is connected to a pre-charge bar signal node, and wherein the first pull up transistor is switched on when a pre-charge signal is a logic high connected the power node to the supply voltage node.

* * * * *